(12) United States Patent
Pittaluga et al.

(10) Patent No.: US 8,593,143 B2
(45) Date of Patent: Nov. 26, 2013

(54) MRI APPARATUS

(75) Inventors: Stefano Pittaluga, Genoa (IT);
Alessandro Trequattrini, Genoa (IT);
Stefano Besio, Genoa (IT); Vincenzo Punzo, S. Giorgio a Cremano (IT)

(73) Assignee: Esaote S.p.A., Genoa (IT)

( * ) Notice: Subject to any disclaimer, the term of this patent is extended or adjusted under 35 U.S.C. 154(b) by 562 days.

(21) Appl. No.: 12/784,623

(22) Filed: May 21, 2010

(65) Prior Publication Data

US 2010/0301861 A1  Dec. 2, 2010

(30) Foreign Application Priority Data

May 29, 2009 (EP) .................................. 09425215

(51) Int. Cl.
*G01V 3/00* (2006.01)
(52) U.S. Cl.
USPC ............................................................ 324/309
(58) Field of Classification Search
USPC ................................................. 324/300–322
See application file for complete search history.

(56) References Cited

U.S. PATENT DOCUMENTS

| | | | | |
|---|---|---|---|---|
| 4,672,346 A * | 6/1987 | Miyamoto et al. | ............. | 335/296 |
| 5,359,310 A * | 10/1994 | Pissanetzky | ................. | 335/301 |
| 6,150,819 A * | 11/2000 | Laskaris et al. | ............... | 324/319 |
| 6,169,402 B1 | 1/2001 | Oka et al. | | |
| 6,191,584 B1 | 2/2001 | Trequattrini et al. | | |
| 6,621,395 B1 * | 9/2003 | Bromberg | ...................... | 335/216 |
| 6,909,347 B2 * | 6/2005 | Wakuda et al. | ................ | 335/296 |
| 6,933,722 B2 * | 8/2005 | Tsuda et al. | ................... | 324/318 |
| 6,937,017 B2 * | 8/2005 | Kakugawa et al. | ........... | 324/319 |
| 7,205,764 B1 * | 4/2007 | Anderson et al. | ............. | 324/307 |
| 7,498,915 B1 | 3/2009 | Leupold | | |
| 7,535,228 B2 * | 5/2009 | Tiernan et al. | ................ | 324/318 |
| 7,560,928 B2 * | 7/2009 | Damadian et al. | ............. | 324/318 |
| 7,560,929 B2 * | 7/2009 | Hsieh et al. | .................... | 324/318 |
| 7,812,607 B2 * | 10/2010 | Damadian et al. | ............ | 324/318 |
| 8,054,077 B2 * | 11/2011 | Hsieh et al. | ................... | 324/307 |
| 2002/0000806 A1 | 1/2002 | Nakamura et al. | | |

(Continued)

FOREIGN PATENT DOCUMENTS

| | | |
|---|---|---|
| EP | 0 921 408 A1 | 6/1999 |
| EP | 1 953 772 A2 | 8/2008 |
| WO | WO 2007/045929 A2 | 4/2007 |

OTHER PUBLICATIONS

European Search Report issued on Nov. 2, 2009.

(Continued)

*Primary Examiner* — Dixomara Vargas
(74) *Attorney, Agent, or Firm* — Buchanan Ingersoll & Rooney PC

(57) ABSTRACT

An MRI apparatus including a magnetic structure defining a cavity for receiving a body under examination or a part thereof, a mechanism for generating a magnetic field inside the cavity, a mechanism for causing the body under examination or a part thereof to emit nuclear magnetic resonance signals, and a mechanism for receiving the nuclear magnetic resonance signals. The mechanism for generating the magnetic field includes one or more elements made of permanently magnetized material of the so-called superconducting bulk material type and, in combination therewith, a mechanism for keeping the magnetization condition of the superconducting bulk material which includes mechanisms for maintaining the temperature of the permanently magnetized material below the critical temperature thereof and for restoring the magnetization of the superconducting bulk material upon a complete or partial demagnetization.

23 Claims, 11 Drawing Sheets

(56) References Cited

U.S. PATENT DOCUMENTS

| | | | |
|---|---|---|---|
| 2005/0083058 A1* | 4/2005 | Itoh et al. | 324/318 |
| 2008/0246567 A1 | 10/2008 | Isogami et al. | |
| 2008/0252404 A1 | 10/2008 | Coombs | |
| 2011/0212840 A1* | 9/2011 | Hong et al. | 505/150 |

OTHER PUBLICATIONS

K. Yokoyama et al., "Homogenous Magnetic Field Generation by High-Tc Oxide Superconductors," IEEE Transactions on Applied Superconductivity, Mar. 2002, pp. 1171-1175, vol. 12, No. 1.

* cited by examiner

MRI APPARATUS

The present invention relates to a MRI apparatus comprising a magnetic structure delimiting a cavity receiving a body under examination or a part thereof, and comprising means for generating a magnetic field inside said cavity, as well as means for causing the body under examination or a part thereof to emit nuclear magnetic resonance signals and means for receiving said nuclear magnetic resonance signals, the MRI apparatus further comprises an electronic processing unit said means receiving the nuclear magnetic resonance signals being electrically connected thereto;

the cavity having at least an access opening through which a body under examination or a part of said body may enter said cavity.

Currently there are two types of MRI apparatuses that are different one with respect to the other as regards the size of the receiving cavity and as regards the strength of the static magnetic field of the nuclear spin orientation. Said two types of apparatuses are called as "total body" apparatuses or "dedicated" apparatuses.

Dedicated apparatuses are smaller and it is easier to install them, since both their size and weight are reduced, therefore it is not necessary to prepare receiving spaces having suitable dimensions and supporting structures fit for the load.

The receiving cavities of the "dedicated" apparatuses have such a size allowing only specific parts of a body and only some anatomical districts thereof to be received and so to be examined. As regards such apparatuses, typically the static magnetic field is generated by permanent magnets not requiring complex, cumbersome and expensive cooling systems that on the contrary are necessary for high-field and total body apparatuses operating by the use of superconducting coils.

However current dedicated apparatuses are still quite cumbersome, since even in the case of a static magnetic field with a medium-low strength it is necessary to have a relatively large amount of magnetized material to reach said strength levels and the magnetic structure needs a supporting structure and further elements such as possible yokes and/or possible ferromagnetic plates. Therefore the reduction of the size of the magnetic structure and of the MRI apparatus is not as much great as the reduction of the receiving cavity for being used only by specific parts of a body. Moreover the medium-low static magnetic field causes the apparatus to be more susceptible to external noise fields, since signals emitted from the body under examination have a relatively low intensity.

The use of conventional methods and materials for generating the static magnetic field, both with permanent magnets, resistive magnets and superconducting magnets, is therefore a restraint of the further reduction of the size and weight of MRI apparatuses and above all of dedicated apparatuses.

Therefore currently there is an unsatisfied need for reducing the size of MRI apparatuses, and particularly of dedicated MRI apparatuses, without considering the fact of further reducing the strength of the static magnetic field. Moreover on the contrary, the strength of the static magnetic field is highly desired to be increased for the same size especially as regards dedicated MRI apparatuses.

Particularly from the document "Construction of various types of strong magnetic field generators using superconducting bulk magnets" Superconductor Science and Technology 18 (2005) S72-S76 di T Oka1, K Yokoyama1 and K Noto, published on 15 Dec. 2004 (available on line at http://stacks.iop.org/SUST/18/S72) magnets made of superconducting bulk material are known, wherein magnetization currents are trapped and firmly frozen. The elements made of said material when kept below the critical temperature maintain the magnetization and behave like conventional permanent magnets.

The above document deals with the study of the above mentioned effect with a particular reference to the so called type-II or high critical temperature superconducting materials. However it is known that such effect occurs also with low critical temperature superconducting materials, that is the so called type-I superconducting materials.

In the above mentioned document the magnetic field generated by such superconducting bulk materials varies extremely throughout the surface of the element made of said material and therefore at a first sight it seems not to fit the purpose.

The document U.S. Pat. No. 7,498,915 discloses an annular magnet made of superconducting material that is permanently magnetized. The fact of manufacturing the magnet with magnetized elements of superconducting bulk material which form the annular structure allows drawbacks related to the homogeneity to be overcome, but the geometry of the magnet is bound by the closed annular shape and so the size of the magnet cannot be reduced as desired and cannot be adapted for example to the geometry of a part of the body it being possible to exclusively dedicate a MRI apparatus to the examination thereof.

Moreover in said document the magnetization and the production of the elements made of superconducting material is complex and rather obscure. Indeed it provides to separately magnetize individual particles made of superconducting material and then said particles are assembled together to form trapezoidal elements that once joined together make the annular structure. How technically assembling together the magnetized particles is not explained above all if considering that particles have to be kept below the critical temperature in order not to lose the magnetization similar to the one of permanent magnets and therefore the fact of assembling them together into the individual elements seems not possible without using processes requiring high temperatures, such as sintering and/or fusion processes.

The teaching of the document U.S. Pat. No. 7,498,915 is therefore very rudimentary as regards the production of a magnetic structure that can be actually manufactured and used in a practically operating MRI apparatus.

Moreover within both the above mentioned documents, there is a precise reference only to the use of high critical temperature superconducting materials. This leads to limits both related to the relatively high costs of said materials, and related to the resistance of said materials, which are subjected to a disaggregation with high magnetic fields since they are relatively porous, therefore when manufacturing permanent magnets made of type-II superconducting material they have to be coated, i.e. they have to be enclosed into an evelope or shell made of metallic material such as steel or the like.

The tendency to limit the use of high critical temperature superconducing materials is due to the fact that for cooling said materials below the critical temperature it is sufficient to use liquid nitrogen, while for cooling low critical temperature superconducting materials it is necessary to use cooling materials with liquid helium or the like. However, considering the field strength that can be reached with permanent magnets made of superconducting bulk materials and the reduction of the size of the magnet for dedicated apparatuses the cooling process has no considerable problems even at lower temperature, since the mass of the superconducting material necessary to achieve the desired field strength and the volume of said mass are relatively limited.

The invention aims at providing a MRI apparatus of the type described hereinbefore which apparatus by means of inexpensive and simple arrangements can be provided with a very small size and substantially corresponding to the size of at least a part of a body said apparatus is substantially solely intended to examine, without considering excessive limitations of the static magnetic field and without using induction currents for generating said static magnetic field.

The invention achieves the above aims by providing a MRI apparatus comprising a magnetic structure defining a cavity for receiving a body under examination or a part thereof, and comprising means for generating a magnetic field inside said cavity, as well as means for causing the body under examination or a part thereof to emit nuclear magnetic resonance signals and means for receiving said nuclear magnetic resonance signals, the MRI apparatus further comprises an electronic processing unit said means receiving the nuclear magnetic resonance signals being electrically connected thereto;

the cavity having at least an access opening through which a body under examination or a part of said body can enter said cavity and wherein means for generating the magnetic field comprise one or more elements made of permanently magnetized material of the type so called superconducting bulk material and i.e. a material wherein magnetization currents are firmly trapped, in combination with said elements made of permanently magnetized material there being provided means for keeping said permanent magnetization condition of said superconducting bulk material.

Said means alternatively or in combination one to the other can be composed of means for keeping the temperature of said permanently magnetized material below the critical temperature thereof and means for magnetizing said superconducting bulk material which can be operated when the magnetization condition changes and/or upon the demagnetization of said superconducting bulk material.

The permanently magnetized superconducting bulk material can be both of the type-I and type-II and particularly said superconducting bulk material is composed of a medium critical temperature material and particularly of $MgB_2$.

Medium critical temperature materials mean materials with a critical temperature from 20 to 60, preferably 35 to 50 kelvin degrees.

The use of such materials is advantageous since unlike low critical temperature materials they do not need the use of liquid helium (4.2° K) which requires means for handling the liquid helium not only for reaching and keeping the liquefaction temperature, but also for safety reasons, since a reduced amount of liquid helium once back in the gaseous condition can cause the percentage of oxygen to change per unit of air volume such to represent a risk of suffocation. For this reason a MRI apparatus using liquid helium requires such construction characteristics to be safe even as regards such point of view and therefore it has an expensive, complex and cumbersome construction.

On the other hand high critical temperature superconducting materials have very porous structures and so they tend to be disintegrated under the action of the magnetic field trapped therein, so they are often enclosed into metal envelopes.

In the case of medium critical temperature materials, they can be cooled below the critical temperature by means of gases having higher liquefaction temperatures with respect to helium and possibly also by means of thermal contact cooling devices called cryo-coolers.

Since in the case of a rise in the temperature above the critical temperature, for example due to a malfunction of means cooling the superconducting bulk material, the latter loses the magnetization condition, the invention provides in addition means for magnetizing the magnetized material which can be mounted in a stationary way into the magnetic structure and in such a relative position to magnetize at least a part of the superconducting bulk material or as an alternative they can be of the removable type the magnetic structure and/or the poles and the magnetization means being provided with mutually removable fastening means.

In the case of removable magnetization means, the removable means for mutually fastening the magnetization means to the magnetic structure and/or to the poles are composed of a combination of sliding guides and slides or saddles which are slidably engaged one to the other according to an insertion/extraction direction of the magnetization means in a position coupling with the corresponding pole.

Advantageously and unlike the known annular structure, the apparatus according to the present invention has at least two magnetic poles, arranged at the opposite sides of the receiving cavity and in a spaced-apart relation substantially corresponding to the dimension in the direction of said distance between the two poles, each magnetic pole being composed at least partially of a superconducting material which is magnetized and kept at a temperature below the critical temperature of said material.

According to a preferred embodiment, the MRI apparatus comprises a magnetic structure with a yoke and two magnetic poles, each magnetic pole comprises in turn a layer of magnetized material in the form of a plate or sheet and the magnetic poles are parallel and opposite one to the other and are formed at two parallel and opposite sides of the yoke, while the magnetizations of the layers of magnetized material being parallel and aligned in the same direction, substantially perpendicular to the inner faces of the main magnetic poles, said magnetic structure being further shaped such to define or enclose a cavity, at least a portion of the volume of said cavity being a space for receiving at least a part of a body under examination, at least a portion of said cavity being permeated by a static magnetic field generated by the magnetic poles and having specific strength and homogeneity characteristics and said magnetic structure being open at least one side parallel to the static magnetic field.

With reference to the construction of the removable magnetization means, the sliding guides for the insertion/extraction of the magnetization means are oriented parallely to the axis of the or one of the access openings of the cavity and they are provided in a position coincident with the passage span defined by said opening such that said magnetization means are inserted/extracted in and from the position coupling to the permanently magnetized material through said access opening.

The yoke can be replaced also by a supporting structure with poles generating the magnetic field secured thereto, which structure does not serve at all for generating the static magnetic field or for guiding the static magnetic field.

According to a further advantageous characteristic, each element made of magnetized material is in the form of a layer like a sheet or plate made of permanently magnetized material having a predetermined thickness and a predetermined area and a predetermined plan shape.

In this case, the guides for inserting/extracting the magnetization means are parallely oriented with respect to the surface of said sheet or plate of permanently magnetized material at the side of said sheet or plate and in such a position that with the magnetization means in the inserted condition into said guides, said means overlap the surface of said sheet or plate made of magnetized material.

According to a possible construction variant, on the side faced towards the cavity each sheet or plate made of magnetized material provided for each magnetic pole is overlapped by a sheet-like or plate-like element made of ferromagnetic material.

When the plan dimension of the layer of superconducting bulk material in the form of a sheet or plate is relatively large, it is advantageous for each sheet or plate made of permanently magnetized material to be composed of at least a layer of blocks or cards made of superconducting bulk material arranged one near the other one into a two-dimensional array of blocks or cards made of superconducting bulk material, means for individually magnetizing each block or each card of superconducting bulk material being provided.

As regards means for keeping the temperature of the individual blocks or individual cards of superconducting bulk material below the critical temperature they can be separated for each block or each card or said means for maintaining the temperature are in common to all the blocks or to all the cards of one sheet or plate made of permanently magnetized material.

As an alternative, each sheet or plate of permanently magnetized material can be in the form of one piece and has a side faced towards the cavity which side has a predetermined plan shape and a predetermined area, said area being ideally divided into a plurality of adjacent sectors like an array of sectors and each one of said sectors being magnetized separately from the other sectors.

In both the cases mentioned above, the magnetization means can be composed of a supporting frame that can be inserted/extracted by the insertion/extraction guides and upon which frame there are mounted means for supporting a magnetization head having such a size to cooperate only with one of the blocks or cards forming a sheet of superconducting bulk material or only with one of the sectors into which the area of a face of the sheet or plate in the form of one piece of superconducting bulk material is ideally divided respectively and it can be moved in two perpendicular directions alternatively in one position cooperating with a block or a card or with a sector one at a time respectively of the sheet or plate in the form of one piece of superconducting bulk material of the plurality of blocks, cards or sectors.

As regards the construction it is possible to provide an embodiment wherein the frame has a first slide slidable along one of two perpendicular directions, which slide is the supporting guide sliding a second slide that is movable along said first slide in said second direction.

As an alternative to the previous solution and still for the two cases with a sheet or plate of superconducting bulk material in the form of one piece or composed of individual adjacent blocks or cards, the magnetization means can be composed of an assembly of individual magnetization units, each one of them having such a size to magnetize a block, a card or a sector forming the sheet or plate of superconducting bulk material said magnetization units being mounted one with respect to the other on a supporting frame according to an order and an arrangement of the relative positions one with respect to the other corresponding to the relative arrangement one with respect to the other of blocks, cards or sectors forming the sheet or plate of superconducting bulk material and such that each one of said magnetization units can be taken in a position cooperating with a corresponding block, a corresponding card or a corresponding sector simultaneously to the other magnetization units and during a single and common motion inserting the assembly of the magnetization units into the insertion or extraction guides.

In this case, each magnetization unit can be operated separately from each other, said units being simultaneously operated at different times according to a predetermined sequence.

By means of the above combinations of characteristics each block, each card or each sector of the plate or sheet of superconducting bulk material can be magnetized such to achieve a different magnetization one from the other for generating a predetermined arrangement of the magnetic field throughout the area of said plate or sheet.

This is very important for achieving a static magnetic field with a high homogeneity between the two magnetic poles and into the cavity since each block, each card or each sector can be magnetized such to optimize the homogeneity conditions of the static magnetic field into the cavity.

Moreover the different magnetization can also be used to compensate systematic aberrations of the static magnetic field provided at the open sides for entering the cavity.

Further improvements are object of the subclaims.

Characteristics of the invention and advantages deriving therefrom will be more clear from the following description of some non limitative embodiments shown in annexed drawings, wherein.

FIGS. 7 to 11 schematically are different variants of the combination of a magnetic pole comprising at least a layer of superconducting bulk material and of magnetization means associated thereto allowing the face of said layer of superconducting bulk material faced towards the receiving cavity to be divided into sectors each sector being magnetized or magnetizable individually and differently from the other sectors.

Figure 10:
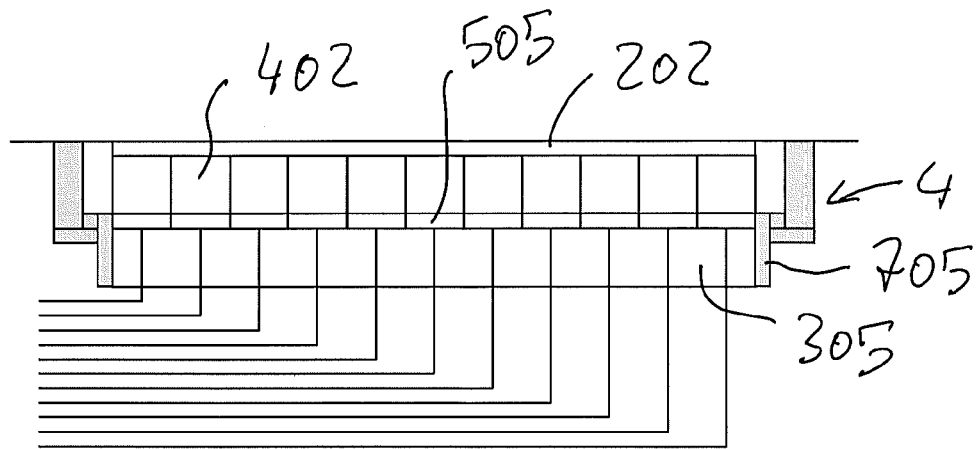
Figure 11:
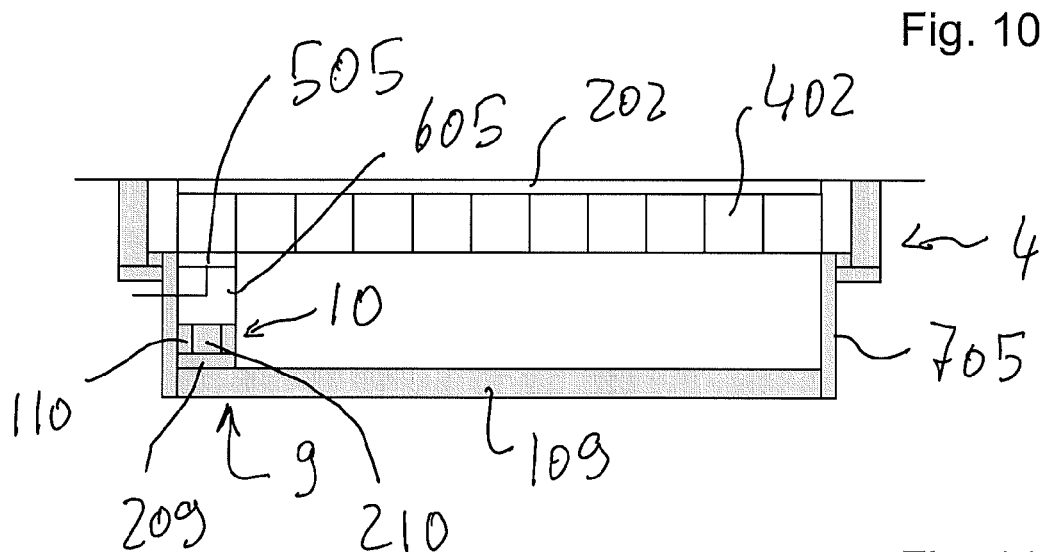
Figure 12:
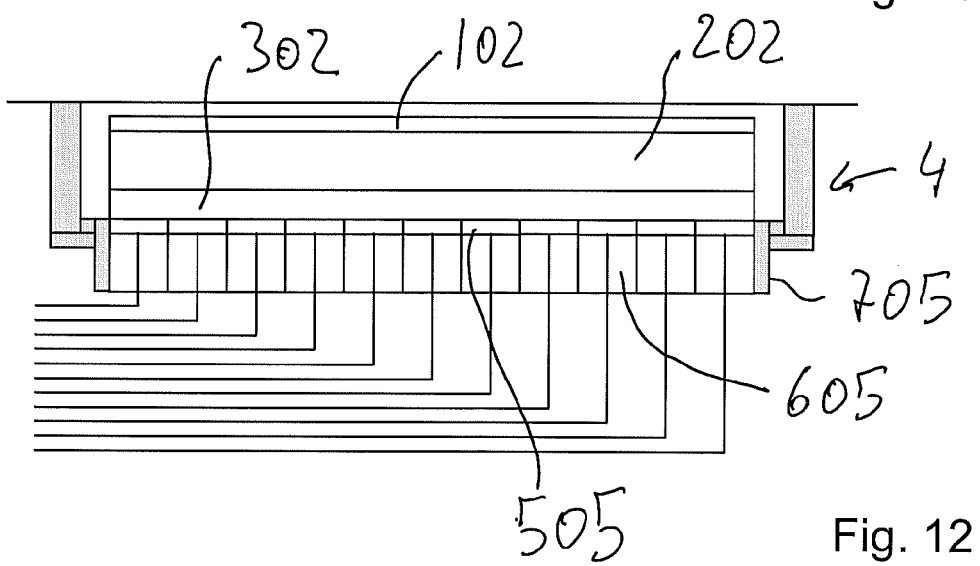

FIG. 12 is an alternative variant embodiment of the combinations according to FIGS. 7 to 11, wherein the magnetization means work on a single sector at a time and they can be moved from one sector to another one of the face of the layer of magnetized material.

Figure 4:
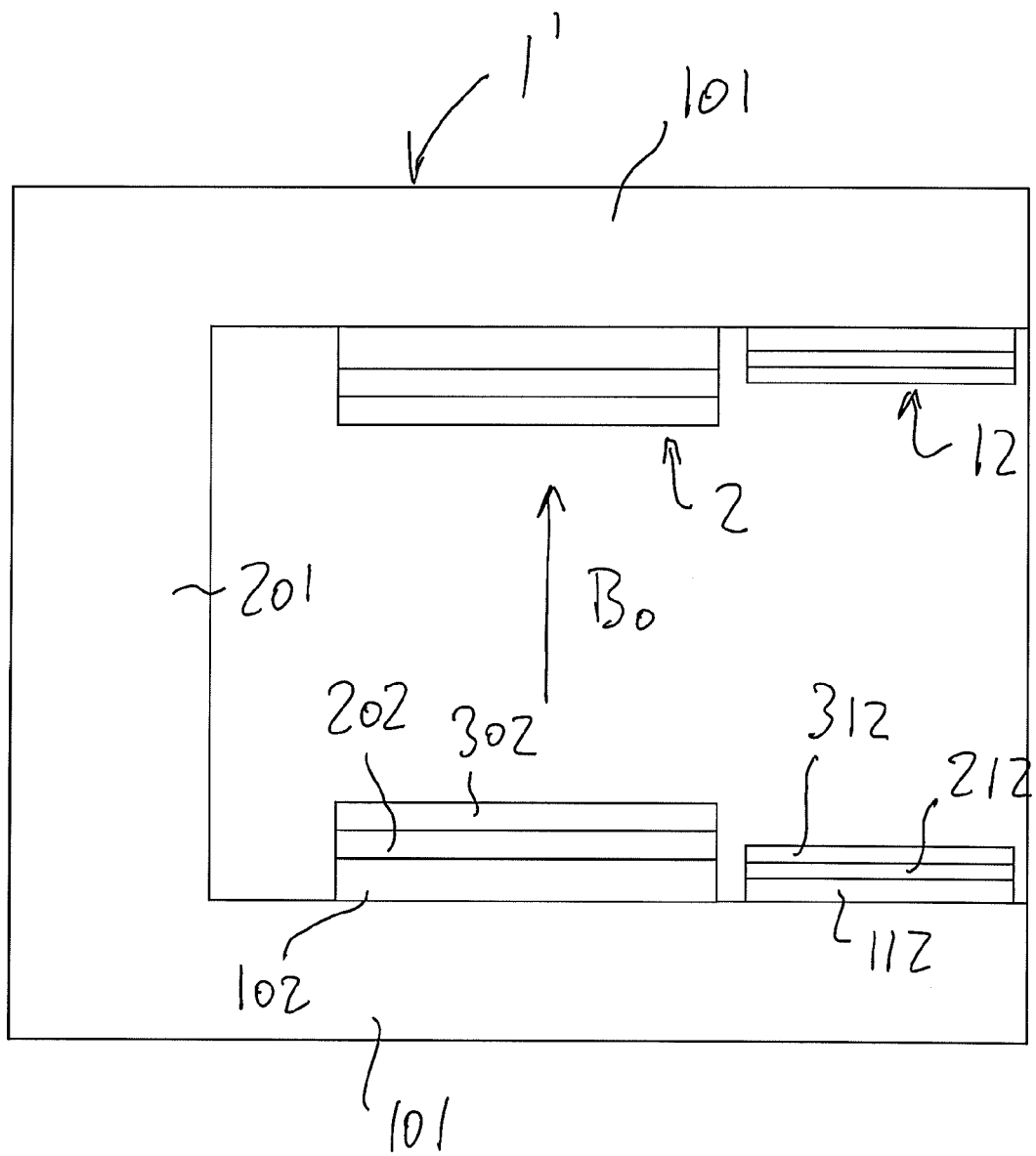
FIG. 4 is a side view of a variant embodiment of the magnetic structure according to the previous figures wherein the structure has three open sides, that is it has a C-shaped or overturned U-shaped cross-section.
Figure 5:
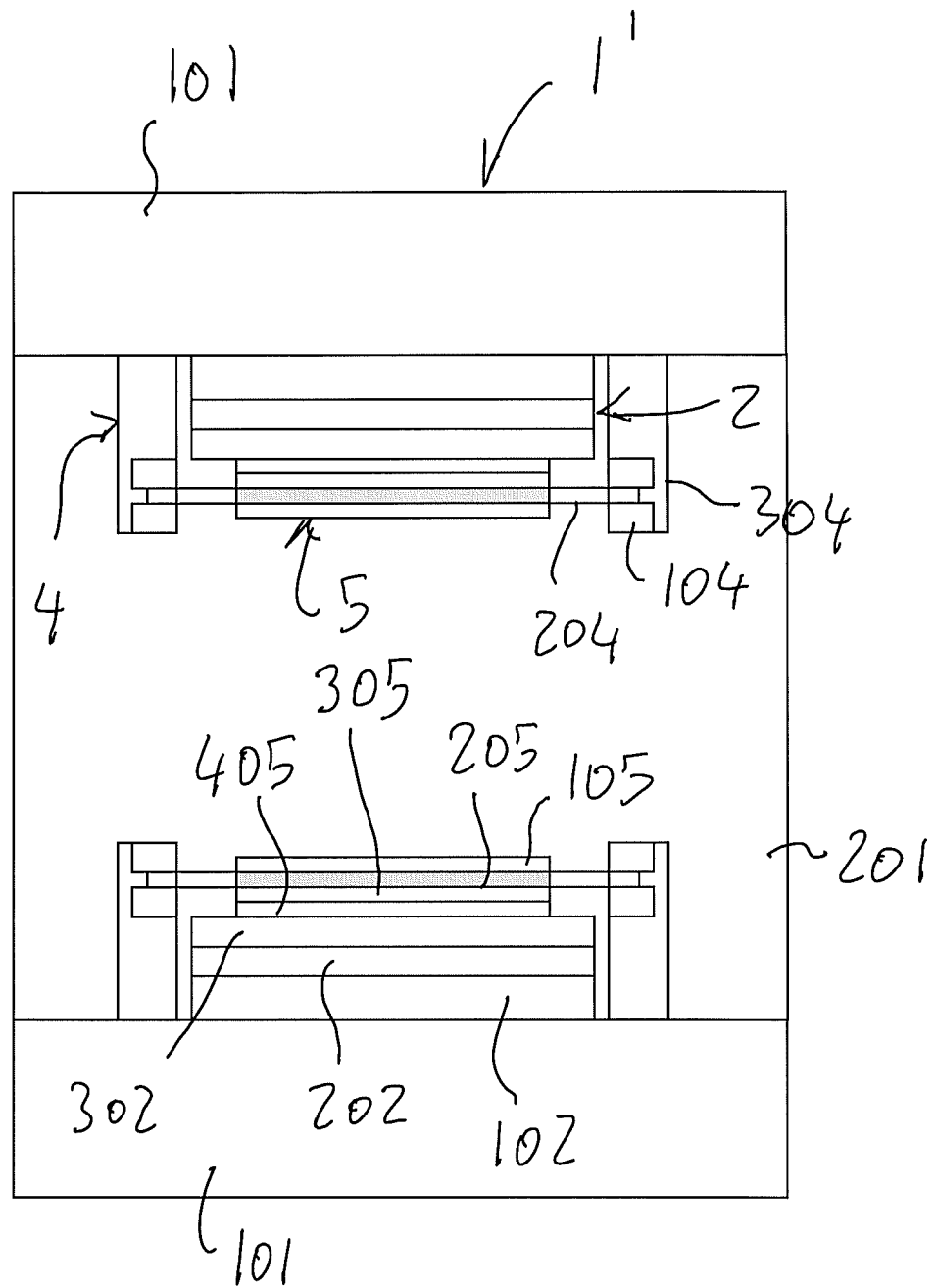
FIG. 5 is a front view of the structure according to FIG. 4 taken along a vertical plane parallel to the vertical closed side and intersecting the two horizontal and parallel branches of the structure in an intermediate position between the main poles and the secondary poles.
Figure 13:
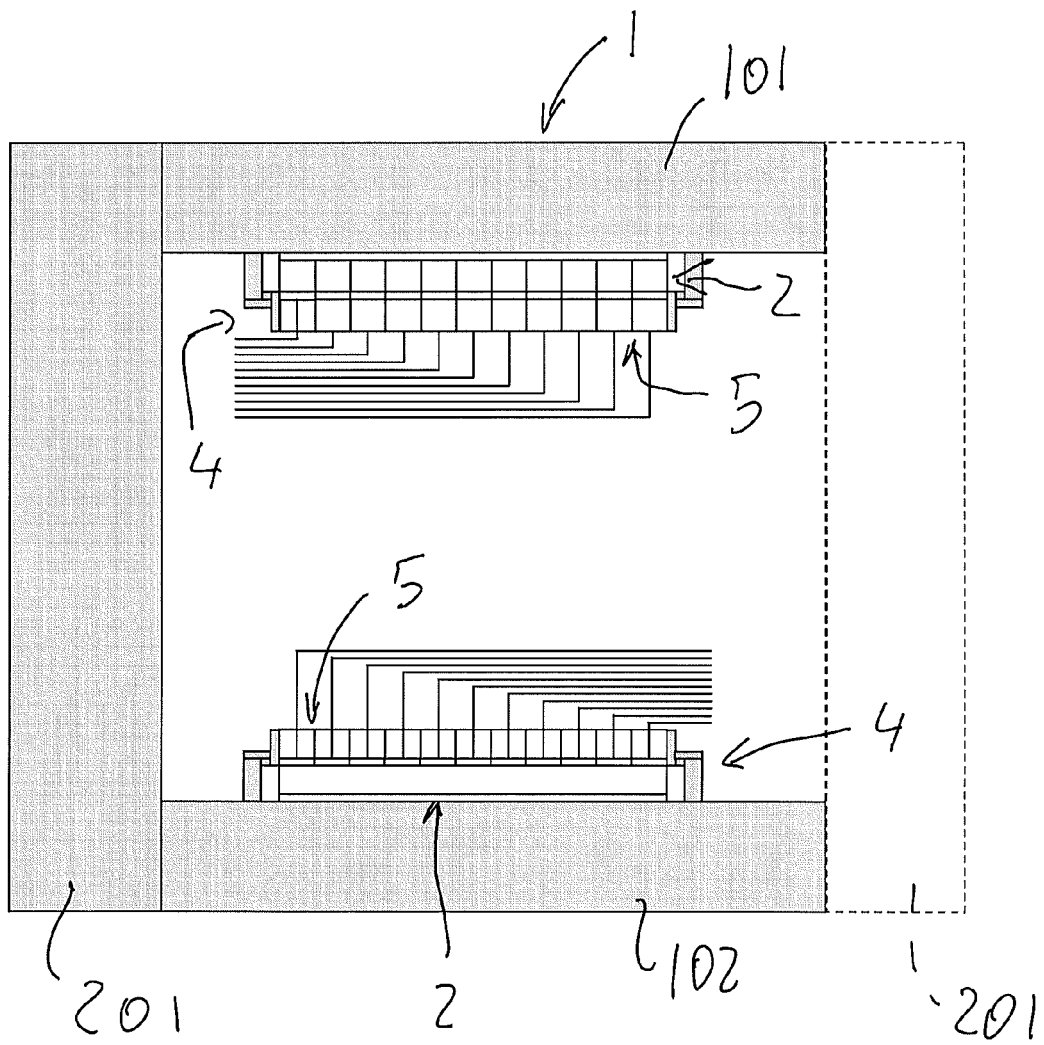
Figure 14:
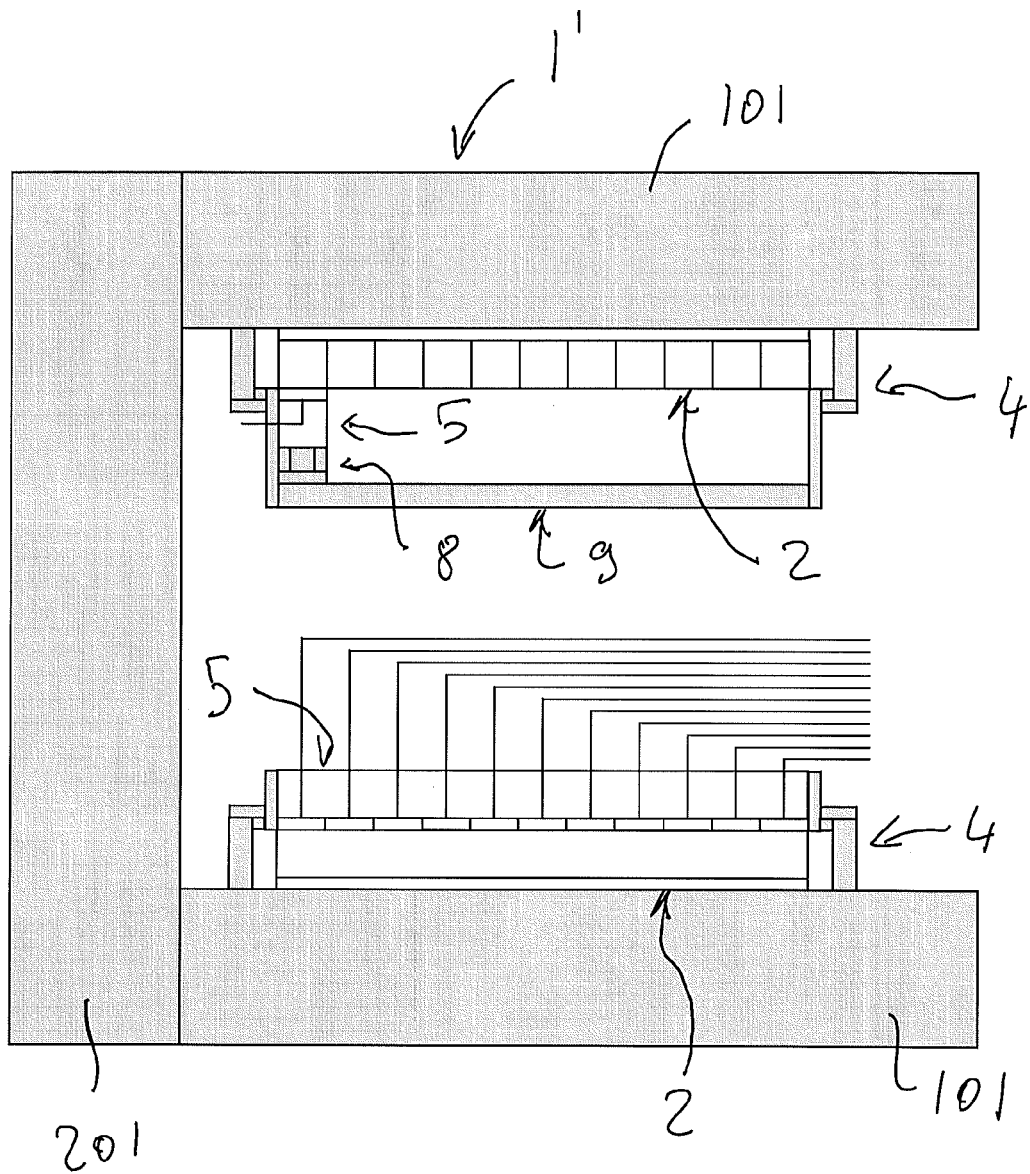

FIGS. 13 and 14 like FIGS. 4 and 5 are a C-shaped or overturned U-shaped magnetic structure wherein combinations of magnetic poles and magnetization means are mounted according to some variants of FIGS. 7 to 12, the upper and lower poles being different one with respect to the other.

Figure 15:
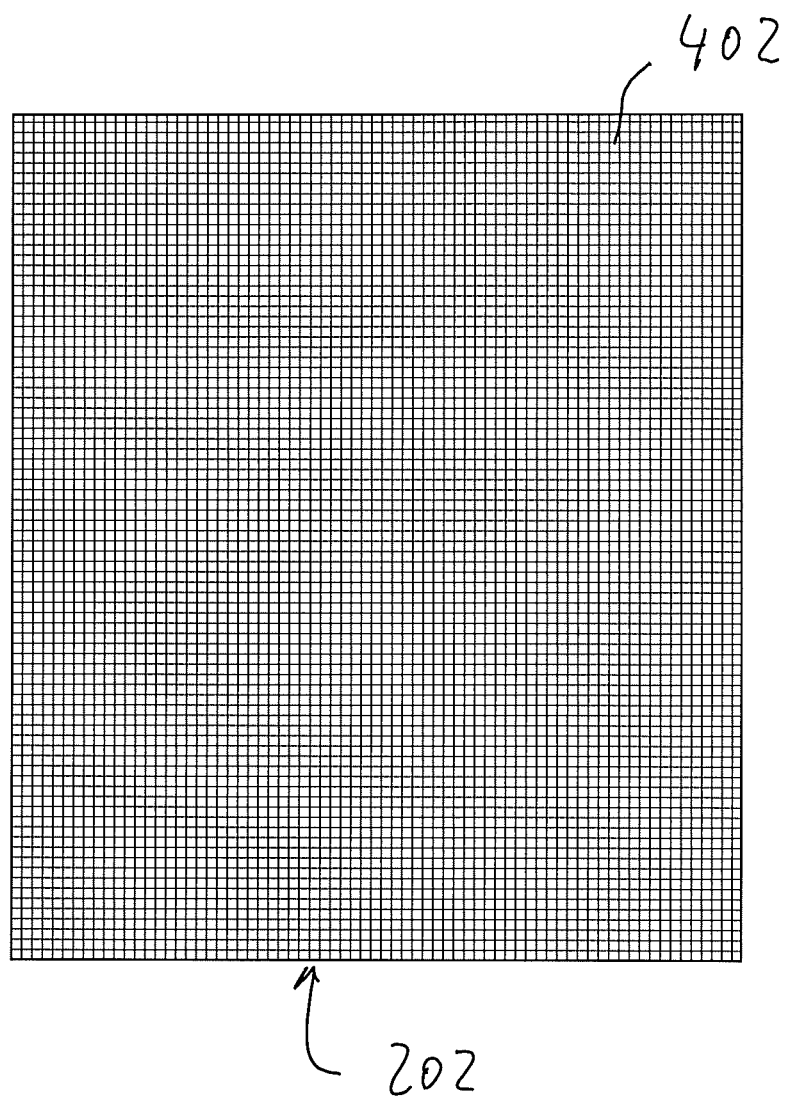

FIG. 15 is a top plan view on the face of a layer of superconducting bulk material faced towards the receiving cavity.

Figure 1:
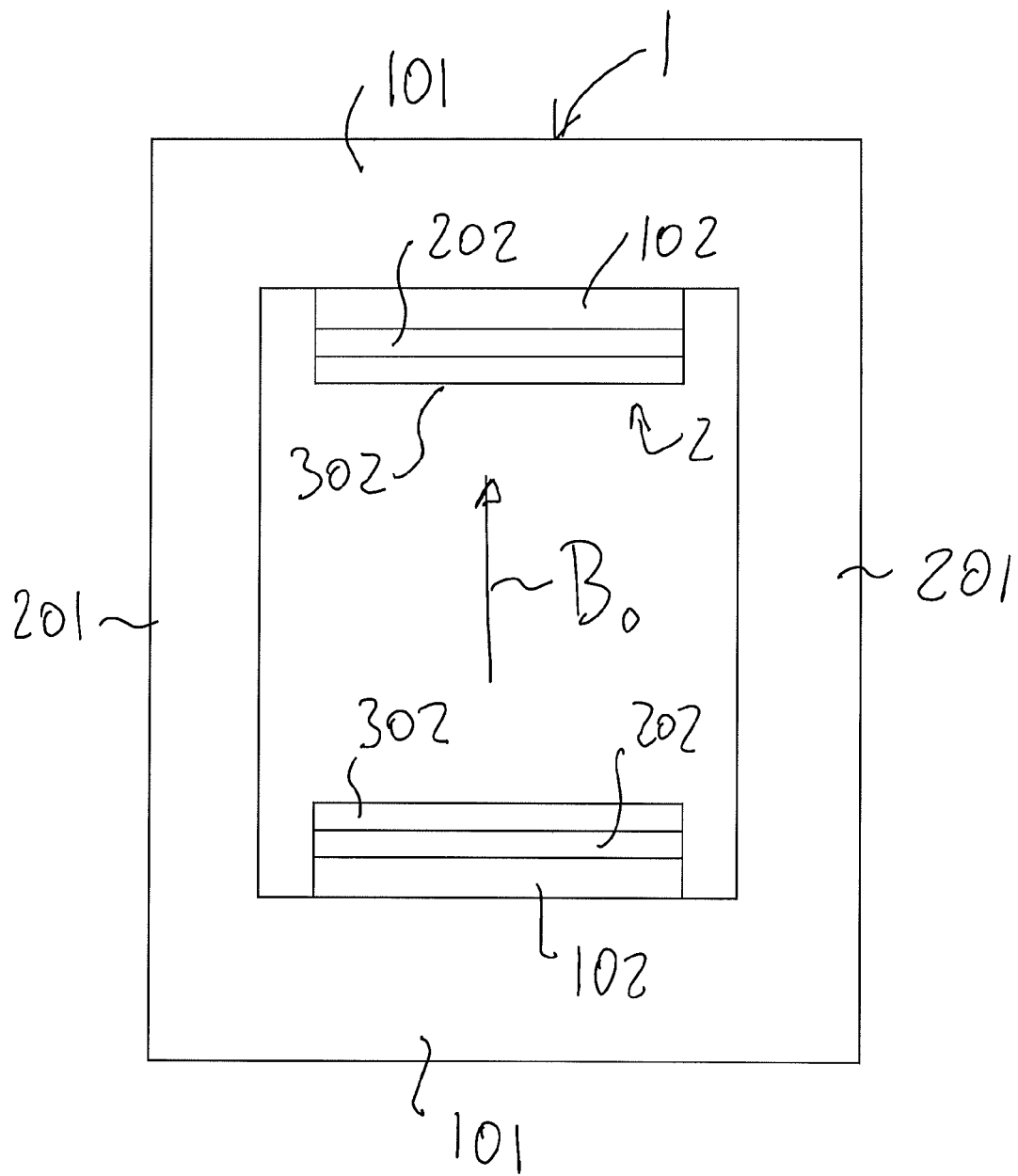
FIG. 1 is a first embodiment of a magnetic structure for generating the static magnetic field into a cavity receiving at least a part of a body of a patient, which structure has an annular or tubolar cross-section.

With reference to FIG. 1, there is schematically shown a magnetic structure of a MRI apparatus i.e. for nuclear magnetic resonance diagnostic imaging, which structure comprises a supporting structure 1 which in the shown embodiment has an annular or tubular cross-section and it encloses on four sides a cavity for receiving at least a part of the body of a patient. In the most simple embodiment the supporting structure has a quadrangular cross-section and it is composed of four plates which are connected together at their ends such to form the four corner areas of the quadrangular annular cross-section. There are two vertical plates denoted by 201 and two horizontal plates denoted by 101. While the shape of the shown supporting structure is the most simple one it is possible to provide also other shapes.

With reference to the center of the cavity delimited by said structure 1 at the two opposite sides it bears two magnetic poles generally denoted by 2 and intended for generating a static magnetic field called Bo which permeates the receiving cavity from one pole to the other one.

The two poles are substantially parallel one with respect to the other and are spaced apart being arranged in a coincident position.

As usual in addition to the magnetic structure the MRI apparatus comprises also means for causing the body under examination or a part thereof to emit nuclear magnetic resonance signals and means for receiving said nuclear magnetic resonance signals and an electronic processing unit said means receiving the nuclear magnetic resonance signals being electrically connected thereto. Such means are not shown in details since they are a known integrating part of MRI apparatuses.

The receiving cavity comprises at least an access opening through which a body under examination or a part of said body can enter said cavity and particularly in the shown embodiment two access openings which are opposite and aligned with reference to an axis perpendicular to the span of said two openings.

This arrangement is known and it is described in several documents such as for example in EP921408 to the same applicant.

Magnetic poles are composed of at least a layer of magnetized material 202 in the form of a plate or sheet and which is supported by one of the plates 101 constituting the supporting structure 1. The magnetized material is of the so called superconducting bulk type and its temperature is kept below the critical temperature by means of cooling means 102. The latter are known and widely used as regards superconducting magnets which are used also within MRI apparatuses and therefore they are not described and shown here in details.

It is possible to provide a layer made of permeable material on the layer 202 of magnetized material such as for example ferromagnetic material in the form of a plate or sheet denoted by 302. It is superposed to the face of the layer 202 made of superconducting magnetized material faced towards the receiving cavity. The plate or sheet may be made of solid material or may be laminated or a portion may be made of solid material and a portion may be laminated. The sheet or plate made of permeable material can be also omitted.

As already described above, the layer of magnetized material is composed of superconducting bulk material. Such materials are known and by means of magnetization sources it is possible to generate internal magnetization currents therein which are kept as long as the material is kept below the critical temperature.

Magnetization methods and materials suitable for being used as permanent magnets made of superconducting material are known and are disclosed for example in U.S. Pat. No. 6,111,490 and U.S. Pat. No. 6,441,710 wherein the magnetization occurs by applying an external pulsed magnetic field generated by an external resistive or superconducting magnet to a solid element made of superconducting material which is cooled below the transition temperature (critical temperature).

Further similar alternatives are described in the following documents: Superconducting Permanent Magnet Made by a bulk MgB2 Ring. G. Giunchi et al. IEEE TRANSACTIONS ON APPLIED SUPERCONDUCTIVITY VOL. 18. NO 2 June 2008; A Persistent-Mode Magnet comprised of YBCO annuli, Yukikazu Iwasa et al. IEEE TRANSACTIONS ON APPLIED SUPERCONDUCTIVITY VOL. 15. NO 2 June 2005; A Novel heat engine for magnetizing superconductors, T. A. Coombs et al. SUPERCONDUCTOR SCIENCE AND TECHNOLOGY 21 (2008) 034001 IOP PUBLISHING 2008, construction of strong magnetic fields generators by high Tc bulk superconductors and its applications, IEEE TRANSACTIONS ON APPLIED SUPERCONDUCTIVITY VOL. 14. No. 2 June 2004.

A magnetization method for bulk superconducting materials which is particularly advantageous and relatively simple as regards the construction is disclosed in WO2007/045929. Here, any type of superconducting material i.e. with a high or low critical temperature is subjected to "permanent" magnetization, with said material being in the cooled condition below the critical temperature and by the generation of waves changing the magnetic flux through said material. The change in the magnetic flux is achieved by providing at least a material changing its magnetic characteristics depending on the temperature and by changing the temperature of said material such to alternatively generate a change in the magnetic characteristics thereof. The document WO2007/045929 has to be considered as a part of such disclosure.

Therefore the magnetization of the layer made of superconducting bulk material may be kept merely by the fact that said material and therefore the layers made of it are kept at a temperature below the critical one and wherein magnetization currents are "frozen" inside the material. A rise in the temperature causes superconductivity conditions to be changed and so causes characteristics of the generated magnetic field to be changed and if such changes cause the temperature to rise above the critical temperature, the material loses its magnetization condition.

As it results from prior art materials that are currently preferably used for making permanent magnets made of superconducting bulk material use materials having a high critical temperature, i.e. about 70° K. This is advantageous since the critical temperature is such to allow the temperature to be kept below the critical temperature of the superconducting bulk material simply by using liquid nitrogen. The fact of reaching such temperature does not require extreme technical efforts and it does not imply high costs. However materials with a high critical temperature are materials with a high granulometry and are of the ceramic type thus with high magnetic fields the stress on the material can cause it to be disgregated. To this aim materials with a high critical temperature have to be enclosed into envelopes made of more resistant metallic material preventing constructional parts made of such materials to be disgregated when the magnetization exceeds predetermined values.

Therefore as regards the layer made of magnetized material the invention provides to use permanent magnets made of superconducting bulk material of the type having a medium critical temperature namely ranging from 20 to 60, preferably from 35 to 50 Kelvin degrees.

The use of such materials is advantageous since unlike low critical temperature materials they do not need the use of liquid helium (4.2° K) which requires means for handling the liquid helium not only for reaching and keeping the liquefaction temperature of helium, but also for safety reasons. Indeed a reduced amount of liquid helium, once back in the gaseous condition, can cause the percentage of oxygen to change per unit of air volume such to represent a risk of suffocation. For this reason a MRI apparatus using liquid helium requires such construction characteristics to be safe even as regards such point of view and therefore it has an expensive, complex and cumbersome construction.

In the case of medium critical temperature materials, they can be cooled below the critical temperature by means of gases having higher liquefaction temperatures with respect to helium and possibly also by means of thermal contact cooling devices called cryo-coolers.

The manufacturing burden of such magnets is greater than the required one if high critical temperature material is used, however the cooling technology for medium critical temperatures has reached considerable development stages and both the fact of obtaining liquid gases suitable for the desired temperature range and the management of such liquid gas for controlling the temperature are not serious technical problems and they do not lead to too high costs.

Surprisingly such materials allow static magnetic field with a high field strength and having a sufficient homogeneity to be achieved within magnetic structures that are very simple and with substantially only two opposite magnetic poles 2 with a simple plate- or sheet-like shape that as regards the construction are similar to the magnetic structures with magnetic poles comprising conventional permanently magnetized materials. For the same overall dimension of the magnetic structure and so of the final apparatus and for the same weight thereof, the static magnetic field that can be obtained is at least for a factor from 2 to greater than the one of an apparatus having a magnetic structure comprising conventional permanent magnets.

As it is clear from what said above, in the case of magnetic structures whose poles comprise permanent magnets made of superconducting bulk material, it is very important to monitor the temperature of the magnetized superconducting material for causing a MRI apparatus to operate properly. A rise in the temperature can cause the generated static magnetic field strength to change as long as it is below the critical temperature or it can cause even the magnetization to be ceased when the temperature rises above the critical one.

To this aim, according to a first advantageous characteristic the magnetic poles 2 described above and having one of the alternative constructional structure are firmly or removably associated to magnetization means which are operatively arranged with respect to the magnetic poles 2, such that they can be used for a new magnetization or for adjusting the magnetization condition of the magnetized or magnetizable superconducting material constituting said magnetic poles.

As it results from the above mentioned prior art there are several magnetization methods and each one of such methods requires the construction of the magnetic structure to be partially modified however this is known to the person skilled in the art once magnetization means to be used are defined.

Figure 2:
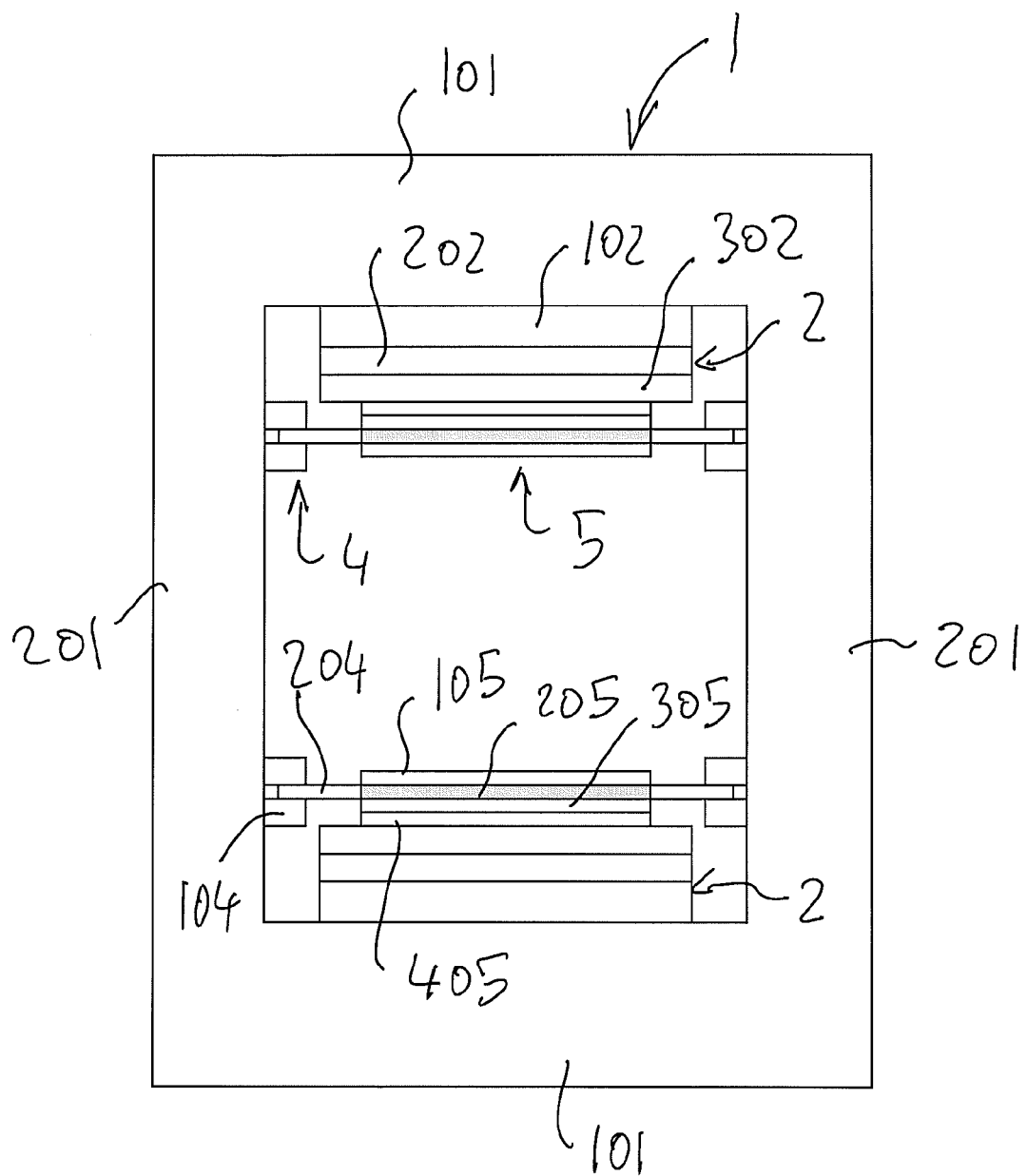
FIG. 2 is a variant embodiment of the magnetic structure according to the precedeing FIG. 1 providing in combination means for magnetizing the superconducting bulk material of magnetic poles which are of the type that can be mounted and removed from the magnetic structure.

FIG. 2 shows a first embodiment of the magnetization means 5 which may be removably mounted within the magnetic structure 1 in such a position that the superconducting bulk material 202 of each one of the at least two poles 2 can be magnetized, once such material has partially or completely lost the magnetization for example due to a temperature rise or to a rise of said temperature above the critical temperature of said superconducting bulk material constituting the plate or sheet 202 made of magnetized material respectively.

With reference to such embodiment, the magnetization means 5 which are schematically shown are the same disclosed in WO2007/045929. This document describes the magnetization as being achieved by the passage of thermal waves which change a pulse of magnetic disordering in an otherwise ordered material by heating said material to above the Curie point thereof.

The embodiment of the magnetization means provided in such example can be anyone of the embodiments described in WO2007/045929 and particularly in the shown example magnetization means are in the form of a combination of layers and they comprise a layer 305 of magnetizable material which is arranged as close as possible to the superconducting bulk material of the layer 202 of magnetized material of the corresponding magnetic pole 2 and at least a temperature changing element (heater or cooler) 205 that is driven by control signals in order to change the temperature of the layer 305 of magnetizable material and so to generate, thermal waves that in turn change the magnetic order or disorder within the magnetizable material and thus they generate magnetic flux changes in the superconducting material.

Moreover said magnetization means 5 at the magnetic poles 2 comprise removable mounting means for being mounted in the position for magnetizing the layer 202 made of superconducting bulk material inside the receiving cavity and through the opening or openings for entering said cavity.

Such means generally denoted by 4 in FIG. 2 can be of any type and advantageously they are composed of side support guides 104 mounted along the opposite walls 201 perpendicular to the surfaces of the magnetic poles 2, particularly to the surface of said poles faced towards the center of the receiving cavity. Said guides 104 schematically shown are sliding guides and define a sliding plane for inserting and extracting the magnetization means which is substantially parallel to the surface of the corresponding magnetic pole 2 faced towards the center of the receiving cavity and they are intended to house slides 204 provided along the corresponding side edges of the magnetization means 5 made as a plate composed of overlapped layers of different functional elements such as the ones 305 and 205 described above, while the thickness of the magnetization means 5 and the position of the guides 104 and slides 204 with respect to the surface of the corresponding magnetic pole 2 is such that, the magnetization means by one of their surfaces overlap the surface of the corresponding magnetic pole 2 faced towards the center of the receiving cavity grazing it or with such a distance as small as possible, said two surfaces being kept faced and parallel one to the other or being leant one against the other.

From the above the advantages of the removable magnetization means 5 are clear. Particularly the embodiment providing magnetization means 5 that can be extracted by being parallely translated with respect to the surface of the corresponding magnetic pole 2 faced towards the center of the receiving cavity and which insertion/extraction direction is perpendicular to an opening for entering the receiving cavity requires the magnetization means 5 to be subjected to a manual operation or to an operation by mechanical means which is simple and which can be carried out by simple construction means. There is the further advantage of making the magnetization means 5 with an operative magnetization surface intended to cooperate with said surface of the magnetic pole 2 parallel thereto and to the insertion/extraction direction. The technical effect is further improved by making the magnetization means 5 like a multi-layered plate and this embodiment can be achieved in a simple way as regards the contruction by using magnetization means of the type described in the document WO2007/045929.

Figure 3:
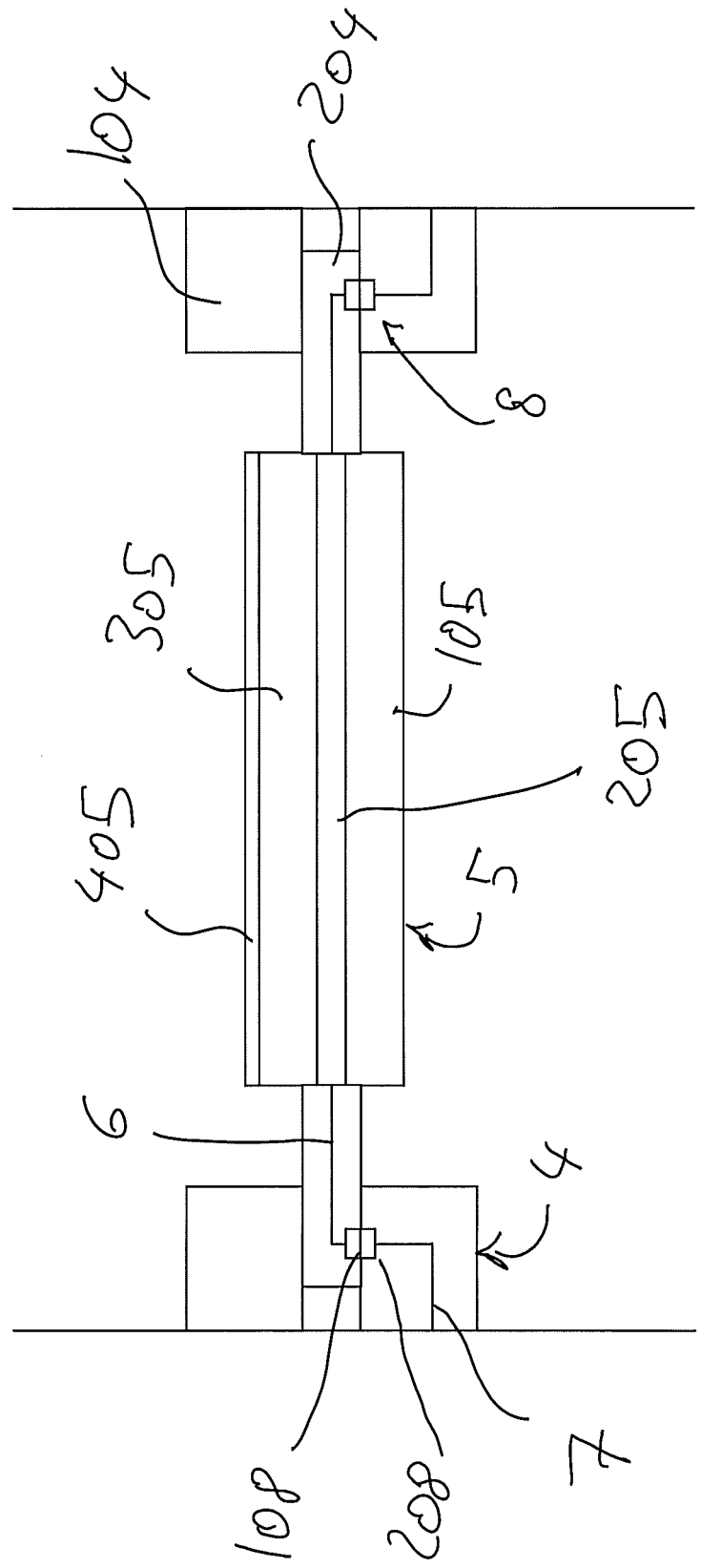
FIG. 3 is a schematic enlarged view of the magnetization means according to FIG. 2 and of the removable supporting means into the cavity of the magnetic structure.

Again according to a further embodiment, whose characteristics are schematically shown in FIG. 3, control cables and/or cables supplying power to the magnetization means 5 are embedded integrated within the guide means and slides and they end into the guides and slides respectively by means of contact terminals cooperating one with the other for automatically generating an electrical contact and/or a conduction contact of other power means when the magnetization means 5 are in the operative position. The FIG. 3 specifically refers to magnetization means 5 having at least a layer 305 of magnetizable material and an element like a plate for changing and particularly for heating said magnetizable material by supplying an heating electrical current. A portion of the power supply cables for the power supply signal is denoted by 7 and it extends into the supporting structure 1, 201 of the magnetic structure, while the other portion of said cables extends into the slides 204 and reaches the heating plate 205. Each one of said cables 6 and 7 ends by a contact terminal element 108, 208. Such contact terminal elements 108, 208 are part of automatic electrical connectors 8 and are placed along the sliding guides 104 and along the slides 204 respectively provided on the magnetization means 5 in such positions that they are in the automatic electrical contact condition one with the other when the magnetization means 5 are in the mounted and operative position magnetizing the corresponding magnetic pole 2.

From what said above it is clear the great simplicity in operating for recovering or restoring the magnetization condition of the layer 202 of superconducting bulk material of each magnetic pole 2 upon the change or interruption of said magnetization condition. Even in the case of heavy magnetization means 5 the shape of the magnetic structure, the structure of the magnetic poles 2, the provision of the insertion and extraction means 4 in the form of guides 104 and slides 204 combinations and also the shape of the magnetization means 5 allow simple motorized means for positioning and mounting in place, as well as for extracting the magnetization means 5 from the magnetic structure to be provided, thus allowing the magnet to be always regenerated, in a simple way and with little economic and time burden.

FIGS. 2 and 3 show a particular and complicated embodiment of the magnetization means which however is not strictly necessary. The technical effect is achieved even by providing only at least the two layers 305 and 205 and that is the layer of magnetizable material and the plate of the heating/cooling means or of means intended to modify the magnetic order of the magnetizable material.

Such as shown it is possible to provide a layer made of insulating material 405 particularly thermal insulating material between the surface of the magnetic pole 2 and the surface faced thereto of the magnetizable material layer 305 of the magnetization means.

Again according to a further improvement in combination with at least the two layers 305 and 205 and that is the layer of magnetizable material and the plate of the heating/cooling means or of means intended for changing the magnetic order of the magnetizable material and/or also in the presence of the layer 405 of insulating material it is possible to provide a layer 105 of permanently magnetized material generating an initial magnetization condition of the magnetizable layer 305, which initial magnetization condition is modified by the thermal waves generated by the temperature changing means 205.

FIGS. 4 and 5 show a side view and a view taken from the front open side of a variant embodiment of the magnetic structure according to the preceding figures in that the magnetic structure has a C-shaped or reversed U-shaped cross section, one of the four side walls 201 being omitted.

Since the structure shown in FIGS. 4 and 5 is not provided with one of the vertical walls 201 to which the two sliding guides 104 for the removable mounting means 4 of the magnetization means 5 were secured in the variants of FIGS. 1 to 3, in such variant, said guides 104 are supported by ribs 304 arranged along two opposite side edges of each magnetic pole 2 and project perpendicularly to the surface of the corresponding magnetic pole 2 faced towards the center of the receiving cavity from the corresponding horizontal wall 101 of the supporting structure 1, which wall supports also the corresponding magnetic pole 2. At the free end of said ribs they support each one a guide 104 intended to cooperate with the extractable magnetization means 5. As regards the magnetic poles 2 and/or the magnetization means 5 and as regards the means for removably mounting the magnetization means 5 and the supply cables 6, 7 with automatic connectors 8, such elements and means are made according to one or more of the variants, combinations or sub-combinations disclosed with reference to the variant embodiment of FIGS. 1 to 3.

The fact of using a structure with three open sides such as the one of FIGS. 4 and 5, and as it is known for such structures, at one of the open sides of the supporting structure and particularly the front side opposite to the single wall 201 perpendicular to the surfaces of the magnetic poles 2 faced towards the center of the receiving cavity, the structure has a further additional magnetic pole 2' interposed between said main magnetic pole 2 and the end of the side 101 of the supporting structure at the open front side. A secondary pole of this type is known in EP921408. In this example the secondary pole can be made according to one or more of the embodiments described in EP921408 and like the main pole 2 as disclosed in the preceding examples and that is by using a superconducting bulk material for the magnetized layer 202 and by providing construction structures and magnetization means with all the arrangements of the combinations and sub-combinations described in the preceding examples for the main magnetic poles 2.

Again according to a further variant embodiment as provided and described in more details in EP921408, between each main pole 2 and the adjacent secondary pole 2' it is possible to provide a simple gap such as shown also in FIG. 4 or such gap can receive an element made of magnetized material having a particular magnetization direction. Even such element can be a conventional permanent magnet or can be composed of superconducting bulk material and can have one or more of the above characteristics described for the main magnetic poles 2 and for the associated magnetization means.

Figure 6:
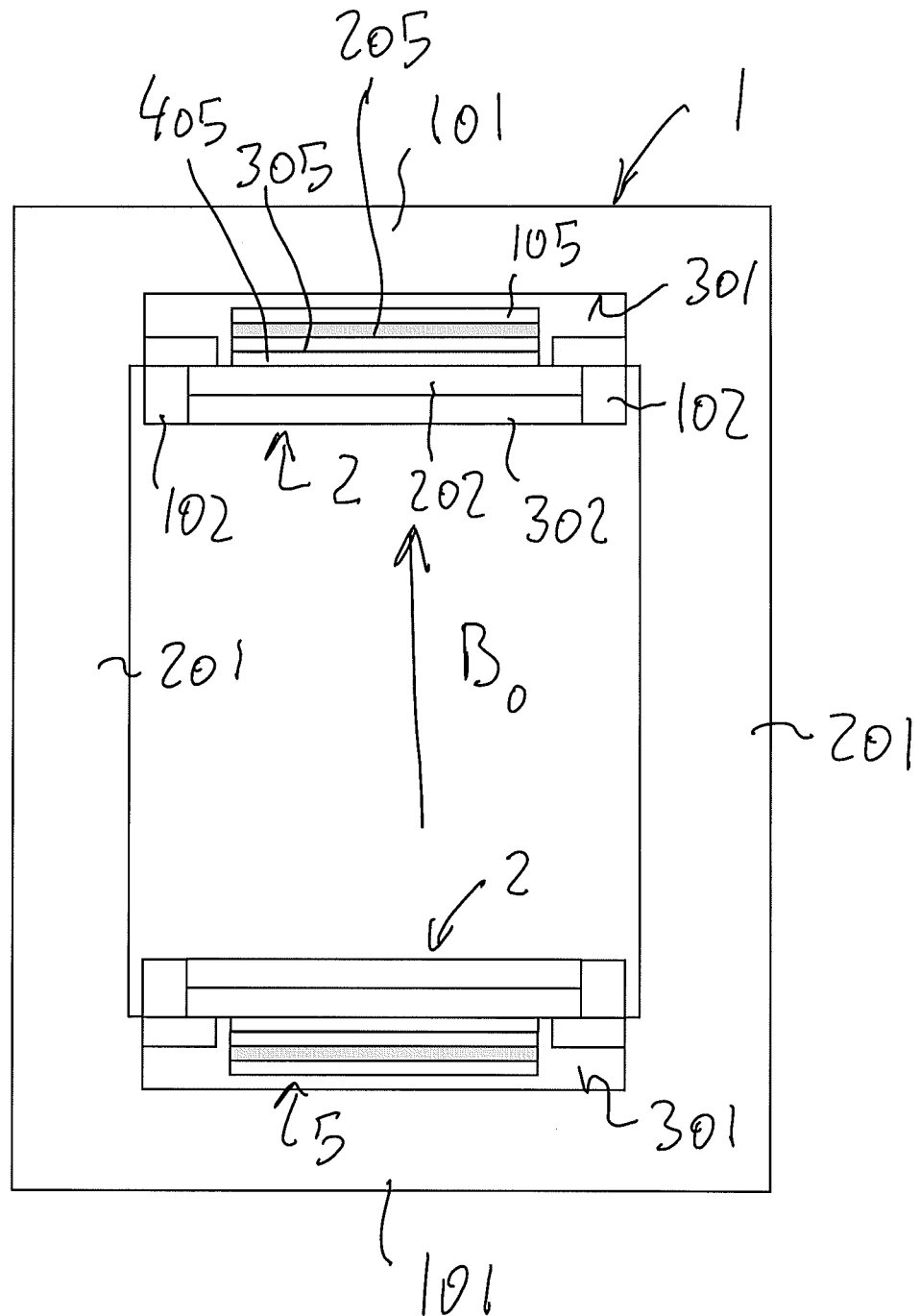
FIG. 6 is a variant embodiment of the magnetic structure according to FIGS. 1 to 3 wherein the magnetization means are firmly mounted therein at the side of the poles faced towards the supporting structure or towards the yoke and opposite to the receiving cavity, into an housing recess.

FIG. 6 shows again a further variant as regards the construction which allows the magnetization means 5 to be firmly mounted together with the magnetic poles 2 on the supporting structure 1. Although such figure shows only the embodiment provided of a supporting structure with an annular cross-section, i.e. closed on itself and similar to the one of FIGS. 1 to 3, the characteristics of such variant apply also to a structure with three open sides such as the one of FIGS. 4 and 5. Moreover the described variant can be provided in combination with one or more of the combinations of the characteristics or sub-combinations of characteristics described with reference to the preceding FIGS. 1 to 5.

Magnetization means 5 are housed into an housing recess 301 provided backwardly of each corresponding magnetic pole 2, i.e. they are overlapped on the side of the magnetic pole 2 opposite to the center of the receiving cavity.

In this case, means for controlling the temperature of the layer 202 of magnetized material denoted by 102 are provided along at least two of the edges of the superconducting material layer 202 which edges are perpendicular to the open sides of the receiving cavity and at least an open side of the recess 301 for the magnetization means 5.

Similarly to what described above, the magnetization means 5 have at least one layer 305 of magnetizable material together with heating/cooling means 205 or means intended to, change the magnetic order of the magnetizable material and possibly with the insulating layer 405 and/or the layer 105 of magnetized material.

Though the present variant embodiment is intended to allow the magnetization means 5 to stay firmly into the magnetic structure of the MRI apparatus, it can be advantageous also in this case to provide removable mounting means 4 that can be made according to one or more of the combinations or sub-combinations of the characteristics described previously with reference to the variant embodiments of FIGS. 1 to 5, for example for carrying out maintenance or repair/replacement operations.

Moreover with reference to all the embodiments of the present figures and of the ones described below, it has to be noted that the supporting structure 1 can be completely or partially a yoke or it can support construction elements of a yoke reclosing the magnetic field generated into the receiving cavity by the two magnetic poles 2 and/or also by possible additional poles 2'.

Again according to a further variant embodiment by using layers 202 of superconducting bulk material which are "permanently" magnetized as long as the temperature of said material is kept below the critical one, the possibility of generating different magnetizations in different regions of one element of said superconducting bulk material has been found. This is very important as regards the present MRI apparatus. In the nuclear magnetic resonance diagnostic imaging it is very important for the static magnetic field acting for generating a reference isotropy for the orientation of nuclear spins to be homogeneous as much as possible inside the receiving cavity of the body of the patient or a part thereof. Generally due to aberrations caused by the finite dimensions of the magnetic structure, the volume wherein such homogeneity is guaranteed is a sub-volume of the overall volume of the receiving cavity such as a central spherical region whose extension is smaller than the one of said receiving cavity. For guaranteeing that optimization steps are often necessary which are called as shimming and which are complex, difficult, relatively long and expensive.

Moreover as it is proved in the prior art the magnetic field generated by an element of superconducting bulk material that is permanently magnetized in the superconducting condition is never homogeneous with reference to the distribution of the field strength along a surface of said element. Thus particularly the magnetic field generated by a magnetic pole 2 of the type described above would not be homogeneous and it would require a very complex and difficult optimization operation.

In this case as an improvement the invention provides to use the possibility of modifying the magnetization locally and for different partial regions of an element of superconducting bulk material. This allows the local dishomogeneities of the magnetic field along the extension of the surface of the magnetic pole 2 faced towards the cavity to be compensated, at least up to a certain variation threshold of said magnetic field generated by said magnetic pole 2 working with superconducting bulk material as permanent magnet.

The invention substantially provides two different variants. According to a first variant, each magnetic pole has a layer 202 of magnetized material composed of superconducting bulk material and it is made of an assembly of adjacent blocks or cards 402 made of said superconducting bulk material. Blocks and cards are arranged side by side along two directions perpendicular one with respect to the other and parallel to the surface of the magnetic pole 2 such to make an array of said blocks or said cards 402. Each block or each card 402 can be individually magnetized depending on the field strength desired in the location corresponding thereto. Due to that the distribution of the magnetic field in the perpendicular extension directions of the magnetic pole 2 can be modified.

An alternative solution provides the same effect to be achieved by providing a layer 202 of magnetized material as one piece i.e. a continuous one, whose face parallel to the surface of the magnetic pole 2 faced towards the center of the receiving cavity is ideally divided into adjacent sectors according to two directions perpendicular one with the other and parallel to said surface and making an array of adjacent sectors.

The plan view of the face of the layer 202 of magnetized material for both the above variants is shown in FIG. 15. In the first case the squares represent the blocks or cards 402 and the partitition lines are the contact surfaces of the block or cards 402. In the second case the squares represent the sectors each one being magnetizable differently from the other sectors and the lines separating them are the boundary lines of said sectors.

FIGS. 7 to 12 schematically show several variant embodiments of the construction of magnetic poles 2 and of the magnetization means 5 with reference to the two principle variant embodiments described above.

Figure 7:
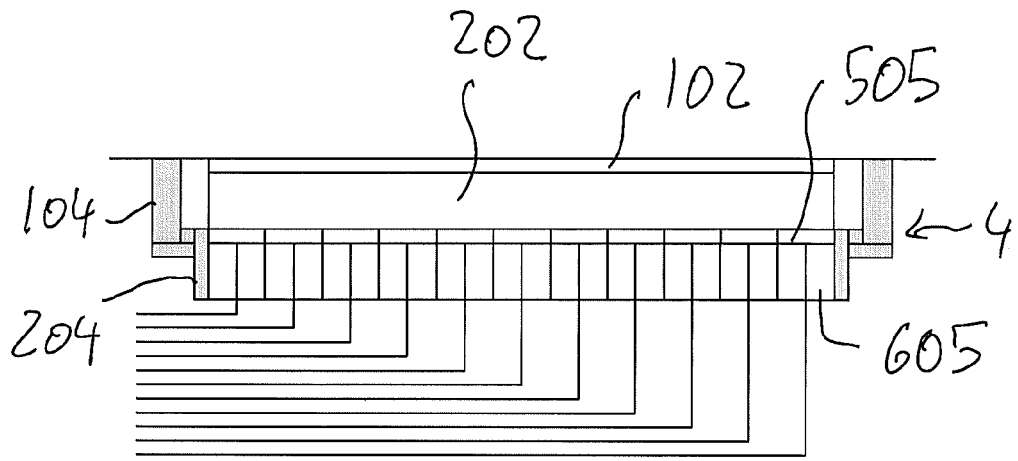

FIGS. 7 and 11 show the magnetic pole 2 and the magnetization means in their minimum composition and that is: the magnetic pole 2 comprises a layer 202 of superconducting bulk material intended to form the layer of magnetized material and the means 102 for cooling the temperature below the critical one, i.e. the transition temperature in the superconducting condition; magnetization means are composed of the layer 302 of magnetizable material and of means 102 for generating the thermal wave. Obviously it is possible to provide as described above also further layers and i.e. for the magnetic poles 2, the plate of permeable or ferromagnetic material and for the magnetization means the insulating layer and/or the layer of permanently magnetized material denoted by 405 and 105 in FIGS. 1 to 5.

FIG. 7 shows the variant wherein the layer 202 of superconducting bulk material is continuous, while the individual sectors are differently magnetized by means of magnetization means 5 dedicated to each individual sector and which can be alternatively simultaneously or sequentially operated. Therefore each sector of the layer of superconducting bulk material is associated to a dedicated magnetization unit composed of at least a block 605 of magnetizable material and of means 505 for generating the thermal wave. The magnetization unit has an operative magnetization surface whose shape and size substantially correspond to the ones of the associated sector of the layer of superconducting bulk material and it overlaps the surface of said sector faced towards the center of the receiving cavity.

Individual magnetization units are mounted into a frame having side slides 204 engaging into sliding guides 104 of the removable mounting means 4 according to one or more of the variants previously described.

Figure 8:
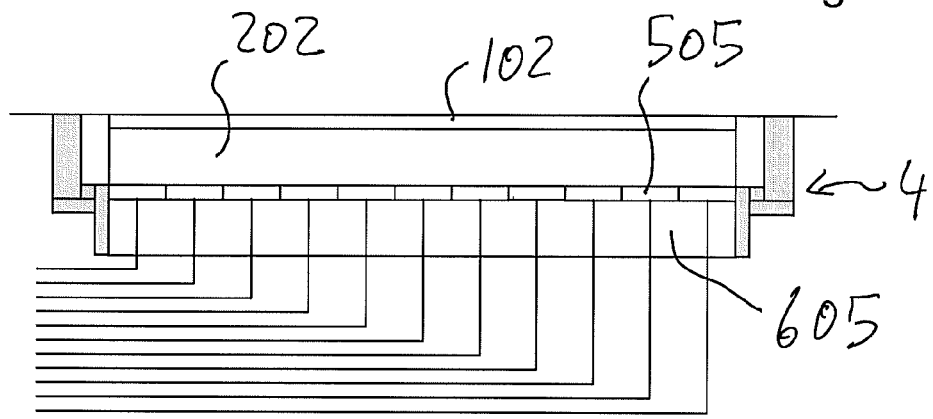

FIG. 8 shows a variant of FIG. 7 wherein even the layer of magnetized material of the magnetization means is continuous, while on the contrary means 505 for generating the thermal wave are composed of elements each one being dedicated to a sector into which the layer 202 of superconducting bulk material of the magnetic pole 202 is divided. Therefore even in this case it is possible to magnetize differently and individually each sector of the layer 202 of superconducting bulk material. The individual magnetization unit is composed of the individual means 505 generating the thermal wave having an operative magnetization surface whose shape and size substantially correspond to the ones of the associated sector of the layer of superconducting bulk material and it overlaps the surface of said sector faced towards the center of the receiving cavity.

Figure 9:
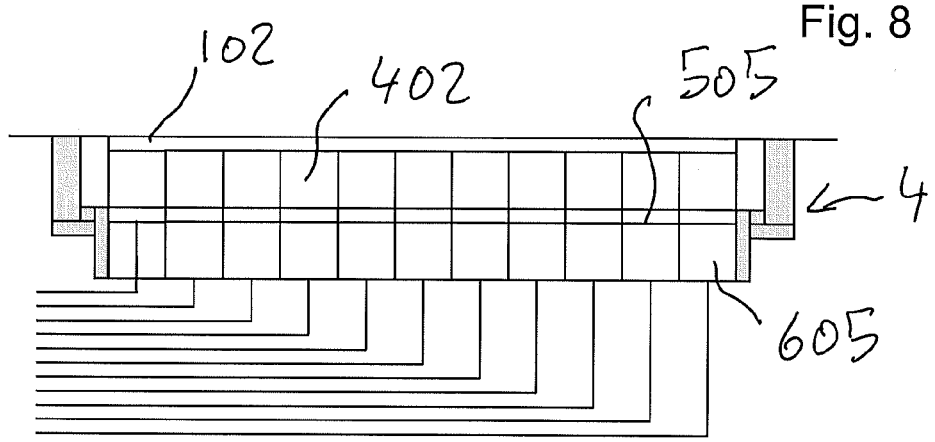

The variant of FIG. 9 is similar to the variant of FIG. 7 as regards the construction of the magnetization means. However in this case the layer of superconducting bulk material is composed of blocks or cards 402. The magnetization units have an operative magnetization surface whose shape and size substantially correspond to the ones of the associated block or the associated card 402 of the layer of superconducting bulk material and they overlap the surface of said block or of said card faced towards the center of the receiving cavity.

The variant of FIG. 10 is similar to FIG. 8 as regards the construction of the magnetization means and of the individual magnetization units constituting it. It differs from the variant of FIG. 8 in that the layer of superconducting bulk material is made of cards or blocks 402. The magnetization units have an operative magnetization surface which is the one of the individual means 505 generating the thermal wave and which operative surface has a shape and a size substantially corresponding to the ones of the associated block or the associated card 402 of the layer of superconducting bulk material and they overlap the surface of said block or said card faced towards the center of the receiving cavity.

The variant of FIG. 11 provides a layer of superconducting bulk material made of cards or blocks 402 like the embodiments of FIGS. 9 and 10. However, in this case, magnetization means are composed of a single magnetization unit 605 made of magnetized material and of means 505 generating the thermal wave like the embodiment according to FIG. 7. The magnetization units have an operative magnetization surface whose shape and size substantially correspond to the ones of each block or card 402 of the layer of superconducting bulk material and it overlaps the surface of one block or one card faced towards the center of the receiving cavity due to the fact that it can be moved from one block to another one or from one card to another one.

Besides complex embodiments that can provide robotized arms or other similar means, an embodiment providing a frame 705 having along the two opposite sides the slides 204 for sliding into the guides 104 integral with the supporting structure is a preferred one since it allows the magnetization means to be extracted and mounted by means of removable mounting means made as the ones denoted by 4 and described and shown with reference to FIGS. 1 to 10. The frame subtends a surface parallel to the surface of the magnetic pole 2 faced towards the center of the receiving cavity and it bears means 9 and 10 for moving said magnetization unit 505, 605 in two directions perpendicular one to the other and parallel to said surface of the magnetic pole faced towards the center of the receiving cavity.

The first translating means 9 permit a translation perpendicular to the one of the guides 104 for inserting and extracting the frame 705 into the receiving cavity and are made of a transversal guide 109 that is stationary and connects the two parallel sides to the slides 204 and to the sliding guides 104. On said transversal guide 109 a slide 209 is slidably mounted in the longitudinal direction of said transversal guide 109. The slide 209 bears in turn a guide 110 for the translating means 10 wherein a slide 201 is slidably mounted. The slide 210 moves along the guide 110 in a direction parallel to the guides 104 for inserting/extracting the frame 705 into the receiving cavity and perpendicularly to the guide 109.

Thanks to the above the magnetization unit can be moved from one of the blocks or cards 402 to another one by providing each one of them to be sequentially differentially magnetized.

As an alternative to what shown in FIG. 11 it is possible to provide the layer of superconducting bulk material to be continuous and to provide the movement of the magnetization unit to lead to the individual magnetization of the individual sectors into which the continuous layer of superconducting bulk material is divided.

FIG. 12 shows again a further embodiment wherein the magnetic pole 2 has a continuous superconducting bulk layer 202 and moreover also a layer of ferromagnetic or permeable material 302, while the magnetization means are made such as shown and described in FIG. 7. The plurality of the shown and described combinations reveals and makes acceptable the fact that even other combinations are possible above all as regards the provision or the absence of layers and/or of structural elements of the magnetization means and of the magnetic poles with reference to the variants described above for the magnetization means and for the magnetic poles.

FIGS. 13 and 14 show some of the variants of FIGS. 7 to 12 and particularly of FIGS. 7, 8, 9 and 11 which are mounted into a supporting structure 1 of the type with three open sides. Said variants are shown for one of the poles of said magnetic structures respectively in order to make clear how each one of them is combined with a supporting structure 1.

FIG. 13, by broken lines, shows the omitted wall 201 perpendicular to the magnetic poles 2 in order to show also the possibility of the variant with an annular cross-section i.e. the structure having only two opposite openings.

As regards the variants of FIGS. 7 to 15, it is important to note how the power supply cables separated from the magnetization units 505, 605 can be integrated into the movable mounting means 4 like what described with reference to the examples of the preceding FIGS. 2 to 4 automatic contact connectors 8 being similarly provided.

FIG. 15 shows the importance of the possibility of providing a different and separate magnetization for the sectors of the surface of the magnetic pole 2 and particularly of the layer of superconducting bulk material.

In this case it has to be noted that such local magnetization diversified per sectors helps for optimizing the homogeneity of the static magnetic field into the receiving cavity and throughout the extension of the magnetic poles 2, but it can help also for avoiding auxiliary or secondary poles to be provided such as shown with reference to FIG. 3 which can be replaced by or whose function can be taken by sub-assemblies of sectors of the magnetic poles, whose magnetization different from the other sectors of the magnetic pole that is of the layer of superconducting bulk material is such to generate the effect of a secondary or auxiliary pole, particularly a secondary or auxiliary pole compensating the field aberrations at the openings of the receiving cavity such as taught by the document EP921408. The different magnetization can involve the magnetization strength, but also the magnetization direction, thus it is possible to obtain also the effect of magnetized material forming inserts separating the main and auxiliary or secondary poles according to the teaching of the document EP921408.

The invention claimed is:

1. MRI apparatus comprising:
a magnetic structure defining a cavity for receiving a body under examination or a part thereof,
means for generating a magnetic field inside said cavity,
means for causing the body under examination or a part thereof to emit nuclear magnetic resonance signals,
means for receiving said nuclear magnetic resonance signals, and
an electronic processing unit, said means receiving the nuclear magnetic resonance signals being electrically connected thereto;
wherein the cavity includes at least an access opening through which a body under examination or a part of said body can enter said cavity; and
wherein said means for generating the magnetic field comprise one or more elements made of permanently magnetized material of the so-called superconducting bulk material type, wherein magnetization currents are firmly trapped, in combination with means for keeping said magnetization condition of said superconducting bulk material.

2. Apparatus according to claim 1, wherein said means for maintaining the magnetization condition of said superconducting bulk material comprise means for keeping the temperature of said superconducting bulk material below the critical temperature thereof.

3. Apparatus according to claim 1, wherein the permanently magnetized superconducting bulk material is of the type-I or type-II.

4. Apparatus according to claim 1, wherein the superconducting bulk material is composed of a medium critical temperature material and particularly of $MgB_2$.

5. Apparatus according to claim 1, wherein the superconducting bulk material is composed of a material with a critical temperature from 20 to 60, preferably 35 to 50 kelvin degrees.

6. Apparatus according to claim 1, wherein the magnetic structure includes at least two poles, and further comprising means for magnetizing the magnetized material which are of the removable type, wherein the magnetic structure and/or the poles and the magnetization means being provided with mutually removable fastening means.

7. Apparatus according to claim 6, wherein the mutually removable fastening means for mutually fastening the magnetization means to the magnetic structure and/or to the poles are composed of a combination of sliding guides and slides or saddles which are slidably engaged one to the other according to an insertion/extraction direction of the magnetization means in a position coupling with the corresponding pole.

8. Apparatus according to claim 7, wherein the sliding guides for the insertion/extraction of the magnetization means are oriented parallel to the axis of the or of one of the access openings of the cavity and they are provided in a position coincident with the passage span defined by said opening such that said magnetization means are inserted/extracted in and from the position coupling to the permanently magnetized material through said access opening.

9. Apparatus according to claim 7, wherein each element made of magnetized material is in the form of a layer like a sheet or plate made of permanently magnetized material having a predetermined thickness and a predetermined area and a predetermined plan shape and the guides for inserting/extracting the magnetization means are oriented parallel with respect to the surface of said sheet or plate of permanently magnetized material at the side of said sheet or plate and in such a position that with the magnetization means in the inserted condition into said guides, said means overlap the surface of said sheet or plate made of magnetized material.

10. Apparatus according to claim 9, further comprising magnetization means composed of a supporting frame that can be inserted/extracted by the insertion/extraction guides and upon which frame there are mounted means for supporting a magnetization head having such a size to cooperate only with one of the blocks or cards forming a sheet of superconducting bulk material or only with one of the sectors into which the area of a face of the sheet or plate in the form of one piece of superconducting bulk material is ideally divided and which is movable in two perpendicular directions alternatively in one position cooperating with a block or a card or with a sector one at a time respectively of the sheet or plate in the form of one piece of superconducting bulk material of the plurality of blocks, cards or sectors.

11. Apparatus according to claim 10, wherein the frame has a first slide slidable along one of two perpendicular directions, which slide is the supporting guide sliding a second slide that is movable along said first slide in said second direction.

12. Apparatus according to claim 10, wherein the magnetization means are composed of an assembly of individual magnetization units, each one of which having such a size to magnetize a block, a card or a sector forming the sheet or plate of superconducting bulk material said magnetization units being mounted one with respect to the other on a supporting frame according to an order and an arrangement of the relative positions one with respect to the other corresponding to the relative arrangement one with respect to the other of blocks, cards or sectors forming the sheet or plate of superconducting bulk material and such that each one of said magnetization units can be taken in a position cooperating with a corresponding block, a corresponding card or a corresponding sector simultaneously to the other magnetization units and during a single and common motion inserting the assembly of the magnetization units into the insertion or extraction guides.

13. Apparatus according to claim 12, wherein each magnetization unit can be operated separately from the others, said units being simultaneously operated at different times according to a predetermined sequence.

14. Apparatus according to claim 13, wherein each block, each card or each sector of the plate or sheet of superconducting bulk material are magnetized such to achieve a different magnetization one with respect to the other for generating a predetermined arrangement of the magnetic field throughout the area of said plate or sheet.

15. Apparatus according to claim 6, wherein the magnetic structure comprises a supporting structure to which the poles generating the magnetic field are secured.

16. Apparatus according to claim 15, wherein the supporting structure is composed of a magnetic yoke or it serves as a yoke reclosing the magnetic flux.

17. Apparatus according to claim 1, wherein each element made of magnetized material is in the form of a layer like a sheet or plate made of permanently magnetized material having a predetermined thickness and a predetermined area and a predetermined plan shape.

18. Apparatus according to claim 17, wherein the magnetic structure includes at least two magnetic poles, and wherein on the side faced towards the cavity each sheet or plate made of magnetized material provided for each magnetic pole is overlapped by a sheet-like or plate-like element made of ferromagnetic material.

19. Apparatus according to claim 17, wherein each sheet or plate made of permanently magnetized material is composed of at least a layer of blocks or cards made of superconducting bulk material arranged one near the other one into a two-dimensional array of blocks or cards made of superconducting bulk material, means for individually magnetizing each block or each card of superconducting bulk material being provided.

20. Apparatus according to claim 19, further comprising means for keeping the temperature of the individual blocks or individual cards of superconducting bulk material below the critical temperature which are separated for each block or each card or are in common to all the blocks or to all the cards of one sheet or plate made of permanently magnetized material.

21. Apparatus according to claim 17, wherein each sheet or plate of permanently magnetized material is as one piece and has a side faced towards the cavity which side has a predetermined plan shape and a predetermined area, said area being ideally divided into a plurality of adjacent sectors like an array of sectors and each one of said sectors being magnetized separately from the other sectors.

22. Apparatus according to claim 1, wherein the magnetic structure comprises a yoke and two magnetic poles, each magnetic pole comprises in turn a layer of magnetized material in the form of a plate or sheet and the magnetic poles are parallel and opposite one to the other and are formed at two parallel and opposite sides of the yoke, while the magnetizations of the layers of magnetized material being parallel and aligned in the same direction, substantially perpendicular to the inner faces of the main magnetic poles said magnetic structure being further shaped such to define or enclose a cavity, at least a portion of the volume of said cavity being a space for receiving at least a part of a body under examination, at least a portion of said cavity being permeated by a static magnetic field generated by the magnetic poles and having specific strength and homogeneity characteristics said magnetic structure being open at least one side parallel to the static magnetic field.

23. Apparatus according to claim 22, wherein along the edges of the at least one open side, in the proximity of the at least one open side, the magnetic structure further comprises at least two additional magnetic poles, each one of said additional magnetic poles comprises a layer of magnetized material and a plate of high-permeability material, said additional magnetic poles extend at least with a substantially equal extent as the main magnetic poles and are parallel and opposite one with respect to the other, said additional magnetic poles being formed at the two parallel and opposite sides supporting the main magnetic poles, while the magnetizations of the layers of magnetized material of the additional magnetic poles are parallel and aligned in the same magnetization direction of the layers of magnetized material of the main magnetic poles, the layer of magnetized material of the additional magnetic poles being made of superconducting bulk material.

\* \* \* \* \*